(12) United States Patent
Maneki

(10) Patent No.: US 7,442,984 B2
(45) Date of Patent: Oct. 28, 2008

(54) SEMICONDUCTOR MEMORY DEVICE AND MANUFACTURING METHOD THEREOF

(75) Inventor: Junya Maneki, Miyagi (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 10/986,867

(22) Filed: Nov. 15, 2004

(65) Prior Publication Data
US 2005/0105330 A1    May 19, 2005

(30) Foreign Application Priority Data
Nov. 14, 2003   (JP)  ............................. 2003-385647
Sep. 30, 2004   (JP)  ............................. 2004-287635

(51) Int. Cl.
*H01L 29/76*   (2006.01)
(52) U.S. Cl. ................. 257/314; 257/315; 257/316; 257/244
(58) Field of Classification Search ................. 257/244, 257/314–316
See application file for complete search history.

(56) References Cited

U.S. PATENT DOCUMENTS 4,935,791 A    6/1990   Namaki et al.
5,204,542 A    4/1993   Namaki et al.
5,731,609 A *  3/1998   Hamamoto et al. ......... 257/302
6,881,659 B2 * 4/2005   Park et al. ................... 438/618

FOREIGN PATENT DOCUMENTS

JP    1-181572    7/1989

OTHER PUBLICATIONS

Applicant's Prior Art Figure 3-1 (Marked Up Figure 3-1 (b)).*
Applicant's Prior Art Figure 3-1 (Marked Up/Highlighted Figure 3-1 (b)).*

* cited by examiner

*Primary Examiner*—Monica Lewis
(74) *Attorney, Agent, or Firm*—Volentine & Whitt, P.L.L.C.

(57) ABSTRACT

An active region is provided which includes a plurality of active region columns extending in a first direction and a plurality of active region rows extending in a second direction substantially orthogonal to the first direction and having concave portions. Floating electrodes and control electrodes are provided on the active region columns. An interlayer insulating film formed as a layer below an upper wiring is provided on the active region and the control electrodes. Conductive sections that electrically connect the upper wiring and the active region are respectively provided on the concave portions on the active region rows.

14 Claims, 9 Drawing Sheets

(a)

(b)

(a)

(b)

(c)

PRIOR ART

US 7,442,984 B2

SEMICONDUCTOR MEMORY DEVICE AND MANUFACTURING METHOD THEREOF

BACKGROUND OF THE INVENTION

1. Field of the Invention

The present invention relates to a structure of a semiconductor memory device (particularly, nonvolatile memory) having a laminated gate structure and a method of manufacturing the same.

2. Description of the Related Art

In a semiconductor memory device having a laminated gate structure, contacts have heretofore been provided at intersecting points of active region columns and active region rows, respectively. Incidentally, the active region columns correspond to an active region extending in a first direction, whereas the active region rows correspond to an active region extending in a second direction substantially orthogonal to the first direction.

FIGS. 3-1 and 3-2 are respectively diagrams showing structures of such a conventional semiconductor memory device. A description will be made here of a nonvolatile memory having floating gates as the semiconductor memory device. FIG. 3-1(a) shows a planar structure of a memory cell of the nonvolatile memory, FIG. 3-1(b) shows a sectional structure of the memory cell, which is taken along line A-A' shown in FIG. 3-1(a), and FIG. 3-1(c) shows a sectional structure of the memory cell, which is taken along line B-B' shown in FIG. 3-1(a), respectively. FIG. 3-2(a) illustrates a planar structure of the memory cell of the nonvolatile memory, and FIG. 3-2(b) depicts an equivalent circuit of the nonvolatile memory shown in FIG. 3-2(a), respectively. The semiconductor memory device having such a structure has been disclosed in, for example, Japanese Unexamined Patent Publication No. Hei 1(1989)-181572 (patent document 1).

As shown in FIG. 3-1, an active region 101 and device isolation regions 102 are formed within a silicon substrate 100. Incidentally, the active region 101 comprises a plurality of active region columns 52 extending in a first direction (corresponding to a vertical direction as viewed in FIG. 3-1), and a plurality of active region rows 53 extending in a second direction (corresponding to a horizontal direction as viewed in FIG. 3-1) substantially orthogonal to the first direction. The active region 101 and the device isolation regions 102 are formed with the boundaries of their side surfaces aslant as shown in FIG. 3-1(b) and FIG. 3-1(c) (In FIG. 3-1(a), however, only the upper surface portion of the active region 101 is shown and the boundaries of the slanted side surfaces of the active region 101 and the device isolation regions 102 are shown in an omitted form).

A first gate insulating film 107 is formed on its corresponding part of the active region 101 (see FIG. 3-1(a) and FIG. 3-1(c)).

A floating gate 103, which serves as each floating electrode, is formed on each of the first gate insulating film 107 and the device isolation regions 102 (see FIG. 3-1(a) and FIG. 3-1(c)). The floating gate 103 is a conductive film made principally of polysilicon doped with an impurity and is formed by the known CVD/photolitho/etching technology.

A control gate 104, which serves as each control electrode through the second gate insulating film 108, is formed on the device isolation regions 102 of between adjacent floating gates and on the floating gates and in the rows direction of the floating gates. (see FIG. 3-1(b) and FIG. 3-1(c))

A control gate 104, which serves as each control gate, is formed on its corresponding second gate insulating film 108 (see FIG. 3-1(a) and FIG. 3-1(c)). The control gate 104 is a conductive film principally made up of two-layer film polycide of polysilicon doped with an impurity and silicide and is formed by the known CVD/photolitho/etching technology. Incidentally, each control gate 104 serves even as a word line.

An interlayer insulating film 109 is formed on the control gate 104, the first gate insulating film 107, and the device isolation regions 102. An upper wiring 110 is formed on the interlayer insulating film 109. (see FIG. 3-1(b) and FIG. 3-1(c)).

Contacts 106, which extend through the interlayer insulating film 109 and make electrical connections between the active region 101 and the upper wiring 110 to be described later, are formed within the interlayer insulating film 109 (see FIG. 3-1(a) and FIG. 3-1(b)). The contacts 106 are formed by firstly forming contact holes extending through the interlayer insulating film 109 by the know CVD/photolitho/etching technology and then embedding a contact embedding material corresponding to a conductive substance into the contact holes. Incidentally, tungsten is principally used as the contact embedding material.

Further, the upper wiring 110 is formed on the interlayer insulating film 109 (see FIG. 3-1(b) and FIG. 3-1(c)). Incidentally, since FIG. 3-1(b) and FIG. 3-1(c) show configurations at the time that the contacts 106 have been formed, the upper wiring 110 formed subsequently is shown with a dotted line.

In such a conventional semiconductor memory device 51, the contacts 106 are respectively provided at intersecting points of the active region columns 52 and the active region rows 53 as shown in FIG. 3-1(a). If such a conventional semiconductor memory device 51 is shown in the form of functional components or constituent elements such as bit lines BL, word lines WL, source lines (called also source/drain) SL, etc., it is then represented as shown in FIG. 3-2(a). If the semiconductor memory device 51 is expressed in an equivalent circuit, it is then represented as shown in FIG. 3-2(b). Incidentally, the source lines SL correspond to portions that do not overlap the contacts 106 and the word lines WL in the active region 101. In FIG. 3-2(a), diagonally-shaped areas indicate fields. In such a conventional semiconductor memory device 51, the active region 101 is formed with the boundary between the side surfaces of the active region 101 and the device isolation region 102 aslant at the intersecting point of the active region column 52 and the active region row 53. In contrast, the active region 101 is vertically formed at a location (an intermediate point of line A-A' in FIG. 3-1(a) by way of example) other than each intersecting point without slanting the boundary between the side surfaces of the active region 101 and the device isolation region 102. Therefore, each contact 106 provided at the intersecting point increases in area brought into contact with the active region 101 at the bottom as compared with the case in which the contact 106 provided at each intersection point is placed in the location (intermediate point of line A-A' in FIG. 3-1(a) by way example) other than the intersecting point. Thus, the conventional semiconductor memory device enables a reduction in contact resistance.

Patent Document 1:

Japanese Unexamined Patent Publication No. Hei 1(1989)-181572 (see FIGS. 1 through 6)

In the conventional semiconductor memory device, the contacts have been provided at the intersecting points of the active region columns 52 and the active region rows 53 respectively as described above.

In such a conventional semiconductor memory device, the part of first gate insulating film 107 is etched excessively when the floating gate 103 is patterned. The first gate insulating film 107 is etched when the floating gate is removed after the control gate 104 and the second gate insulating film 108 are patterned. The floating gate 103 is formed with polysilicon etc. Liquid into which polysilicon is easy to etch is used in etching process. The first gate insulating film 107 is removed completely for the twice overetching. Furthermore, the silicon of active region is also etched.

Meanwhile, patterning is being miniaturized or scaled down in recent years in particular. With its scaled-down, the wiring width and depth of a source line is becoming very narrow. Each overetched portion (i.e., concave portion) 105 that serves as the source line contact is etched deep as the wiring width of the source line becomes small, thereby causing an increase in resistance value. Therefore, the conventional semiconductor memory device has the problem that upon data writing, for example, a current value is reduced so that charge retention characteristics are markedly degraded.

SUMMARY OF THE INVENTION

With the foregoing problems in view, a semiconductor memory device according to the present invention comprises an active region comprising a plurality of active region columns extending in a first direction, and a plurality of active region rows extending in a second direction substantially orthogonal to the first direction and having concave portions, floating electrodes and control electrodes provided on the active region columns, an interlayer insulating film formed as a layer below an upper wiring, which is provided on the active region and the control electrodes, and conductive sections electrically connecting the upper wiring and the active region, which are respectively provided on the concave portions on the active region rows.

The semiconductor memory device according to the present invention includes contacts corresponding to the conductive sections provided on their corresponding concave portions lying on the active region rows. Therefore, an increase in resistance value can be suppressed since a conductive substance is embedded into the concave portions.

A method of manufacturing the semiconductor memory device having such a configuration comprises the following steps of forming an active region comprising a plurality of active region columns extending in a first direction, and a plurality of active region rows extending in a second direction substantially orthogonal to the first direction and having concave portions, forming floating electrodes and control electrodes on the active region columns, forming an interlayer insulating film provided as a layer below an upper wiring, on the active region and the control electrodes, and forming conductive sections which electrically connect the upper wiring and the active region, on the concave portions lying on the active region rows.

The semiconductor memory device according to the present invention is capable of suppressing an increase in resistance value since the conductive substance is embedded in the concave portions. It is, therefore, possible to prevent degradation in charge retention characteristics due to a reduction in current value upon writing of data, for example.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

FIG. 1-2 is a diagram illustrating a structure of the semiconductor memory device according to the present invention;

FIG. 2-1 is a diagram showing a process for manufacturing a semiconductor memory device according to the present invention;

FIG. 2-2 is a diagram illustrating a process for manufacturing the semiconductor memory device according to the present invention;

FIG. 2-3 is a diagram depicting a process for manufacturing the semiconductor memory device according to the present invention;

FIG. 2-4 is a diagram showing a process for manufacturing the semiconductor memory device according to the present invention;

FIG. 2-5 is a diagram illustrating a process for manufacturing the semiconductor memory device according to the present invention;

FIG. 3-1 is a diagram showing a structure of a conventional semiconductor memory device; and FIG. 3-2 is a diagram illustrating a structure of the conventional semiconductor memory device.

DETAILED DESCRIPTION OF THE INVENTION

Figure 1:
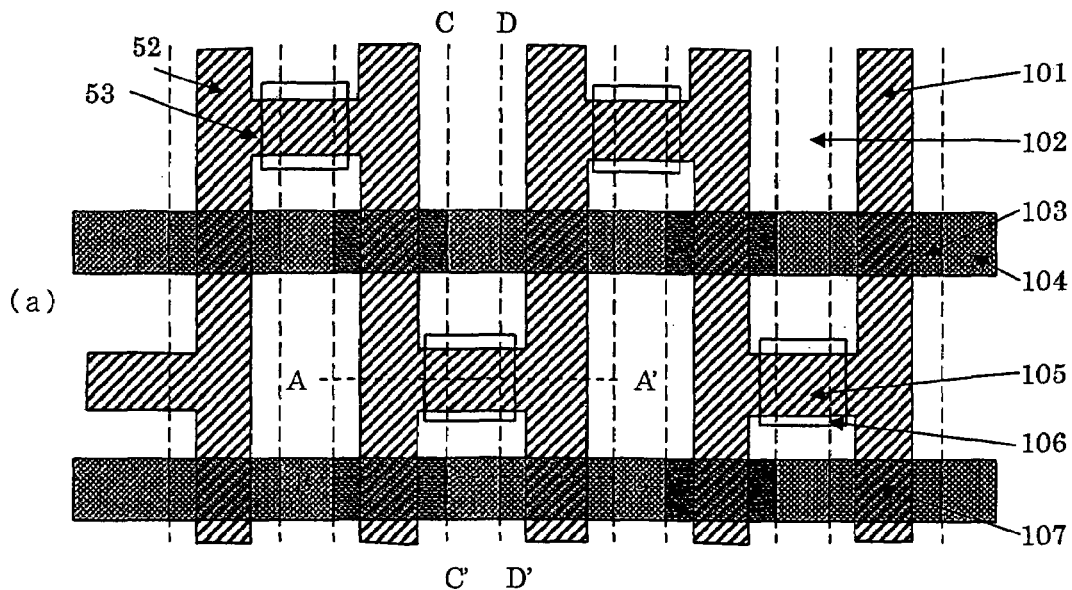
FIG. 1-1 is a diagram showing a structure of a semiconductor memory device according to the present invention.
Figure 1:
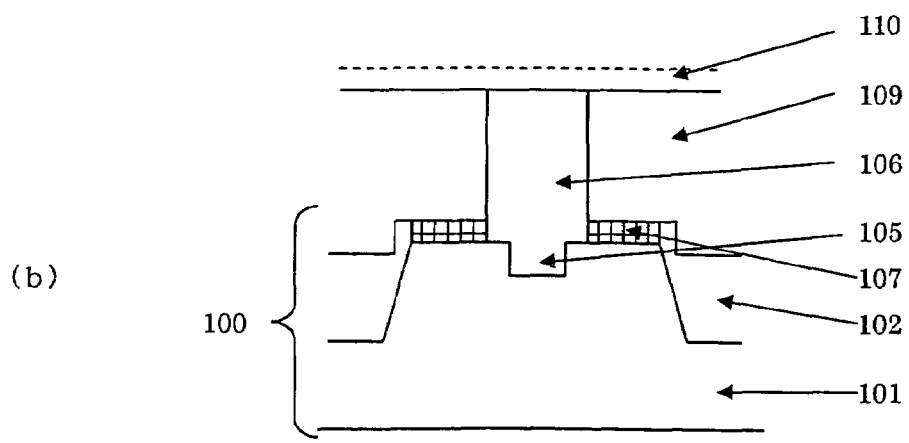
Figure 1:
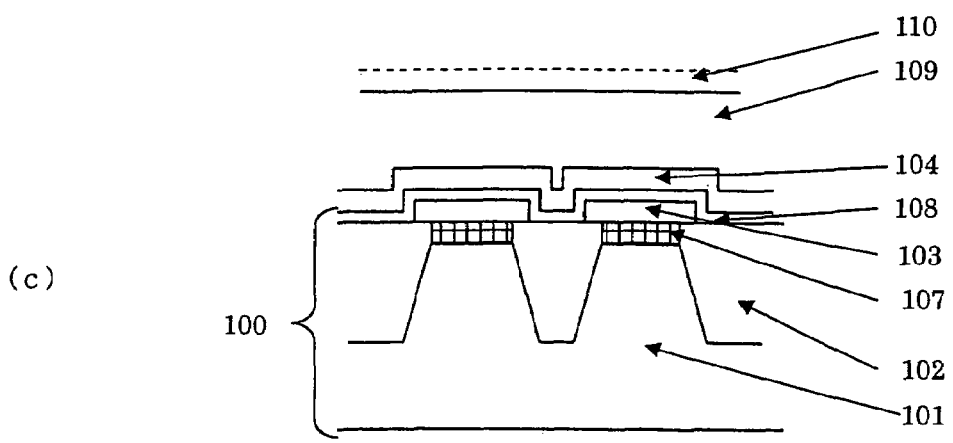
Figure 1:
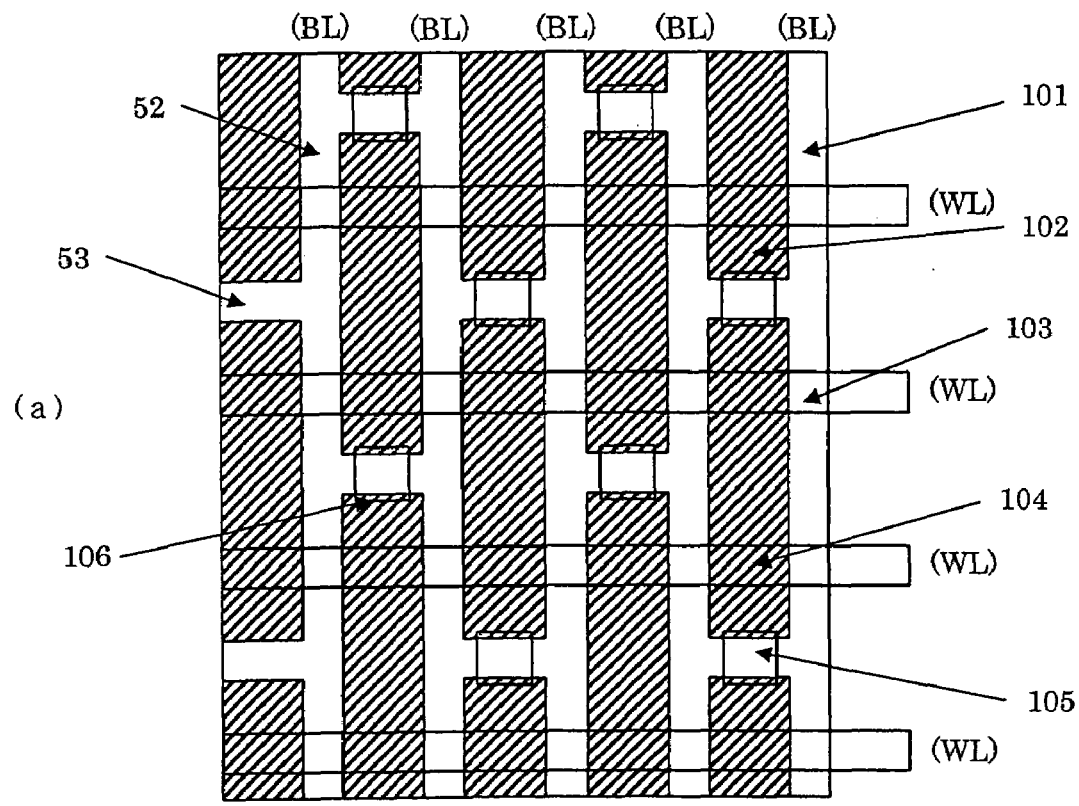

In a semiconductor memory device according to the present invention, contacts corresponding to conductive sections are respectively provided on concave portions lying on active region rows. That is, they are respectively provided between respective adjacent intersecting points of active region columns and the active region rows and on portions that overlap in etching upon forming floating and control gates in a planar structure. Incidentally, if semiconductor memory devices each having a laminated gate structure are adopted, then the present invention is applicable to all.

Preferred embodiments of the present invention will be explained hereinbelow with reference to the accompanying drawings. Incidentally, the respective drawings are merely approximate illustrations to such a degree that the present invention can be understood. Thus, the present invention is not limited to the illustrated embodiments alone. In the respective drawings, common constituent elements and similar constituent elements are respectively identified by the same reference numerals, and the description of their common constituent elements will therefore be omitted.

(Configuration of Semiconductor Memory Device)

A configuration of a semiconductor memory device according to an embodiment of the present invention will be explained below using FIG. 1-1 and FIG. 1-2.

Figure 2:
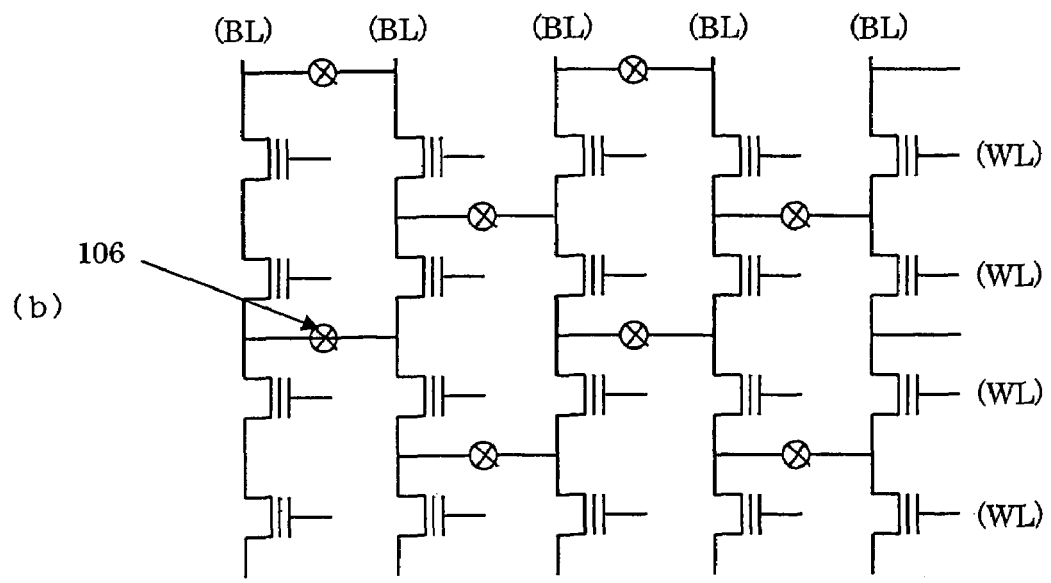
Figures 1, 2:
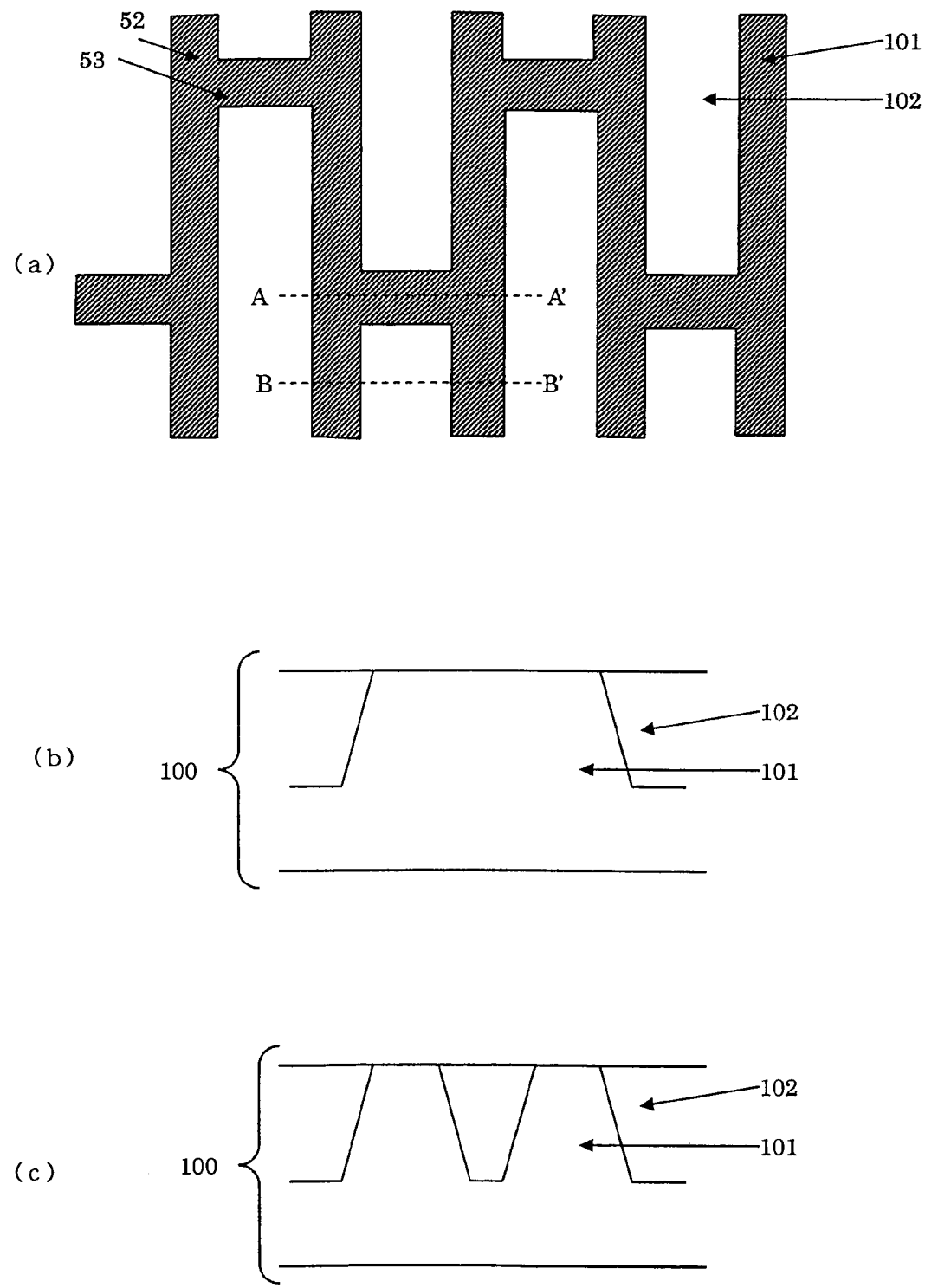
Figure 2:
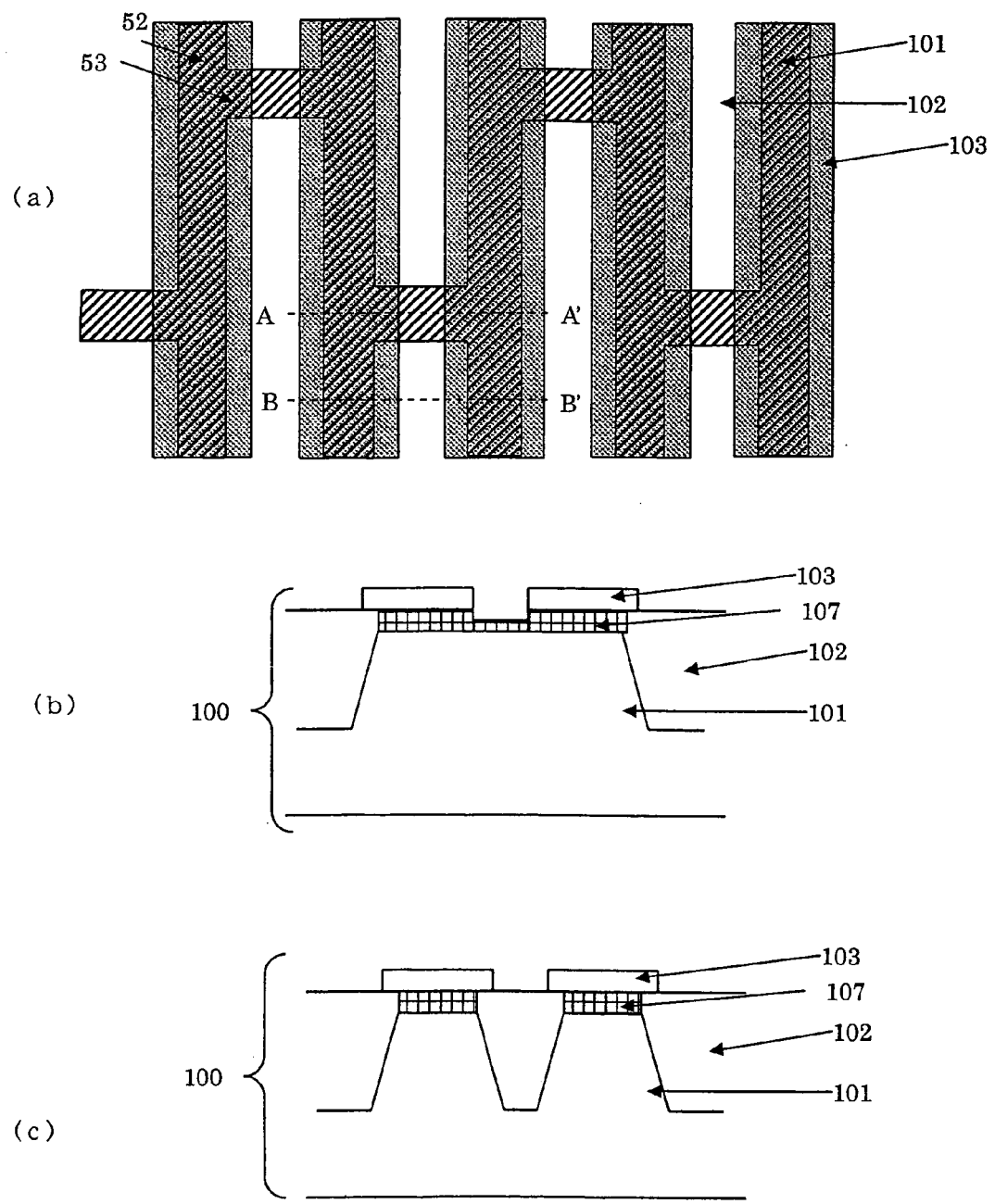
Figures 2, 3:
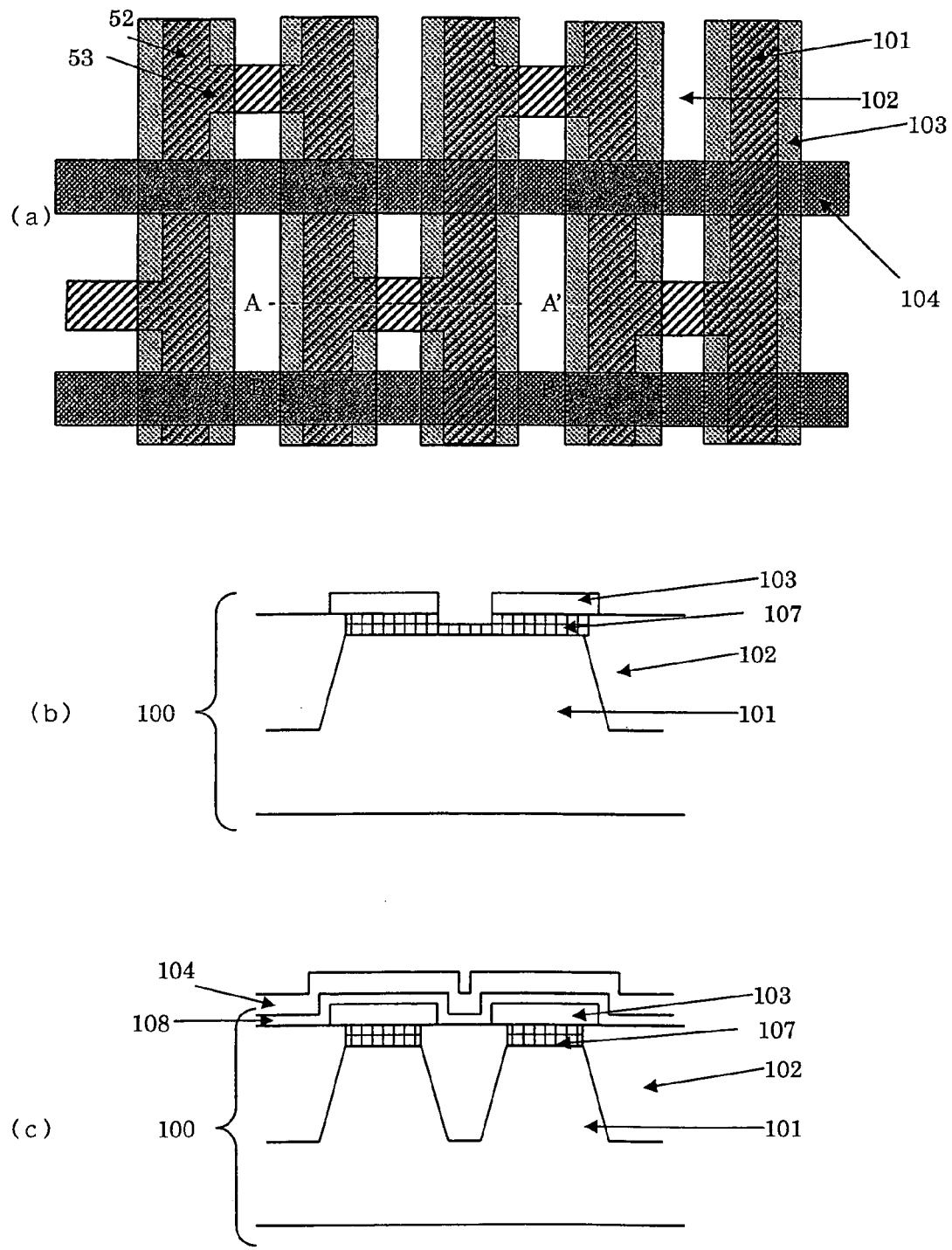
Figure 2:
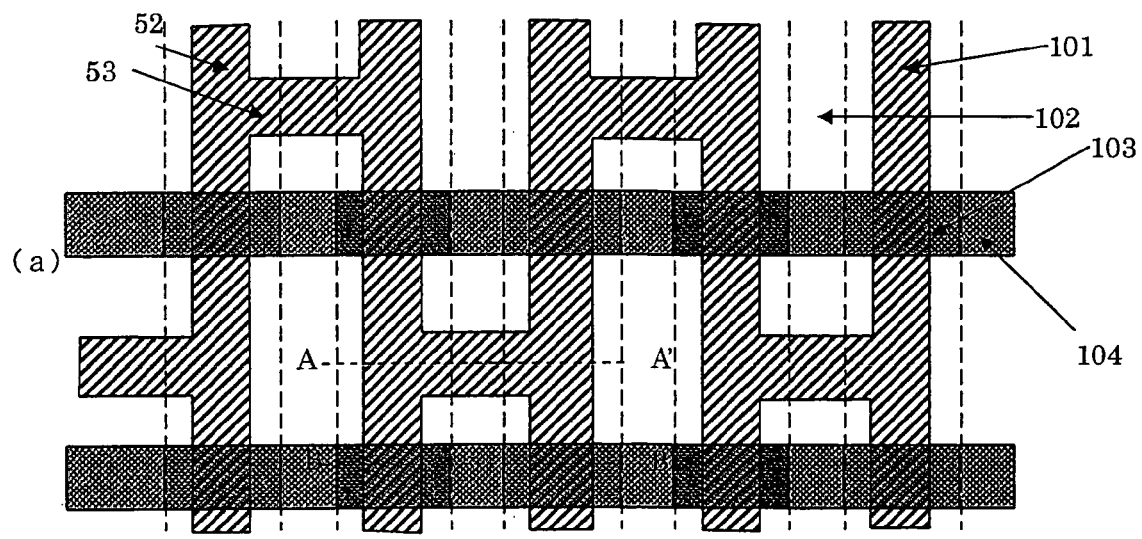
Figure 3:
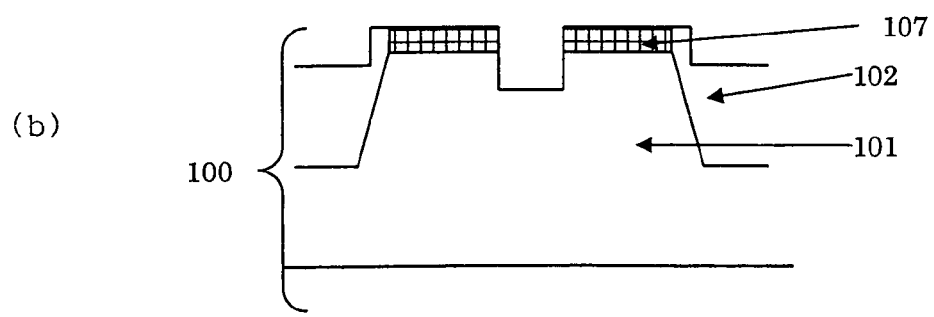
Figure 4:
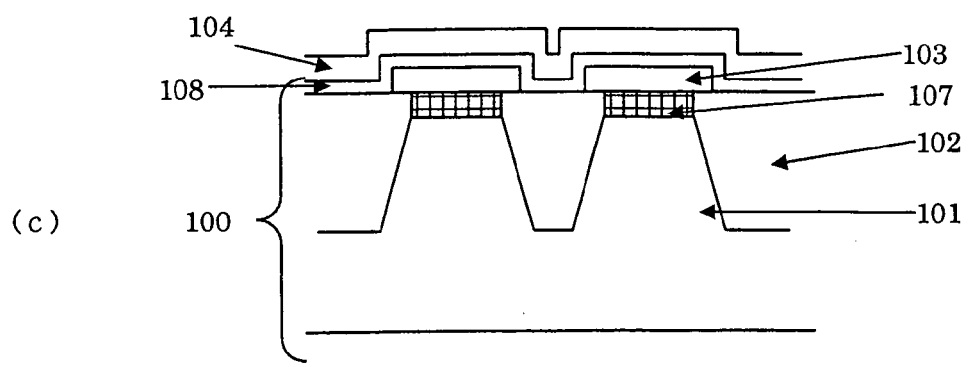
Figures 2, 3, 4, 5:
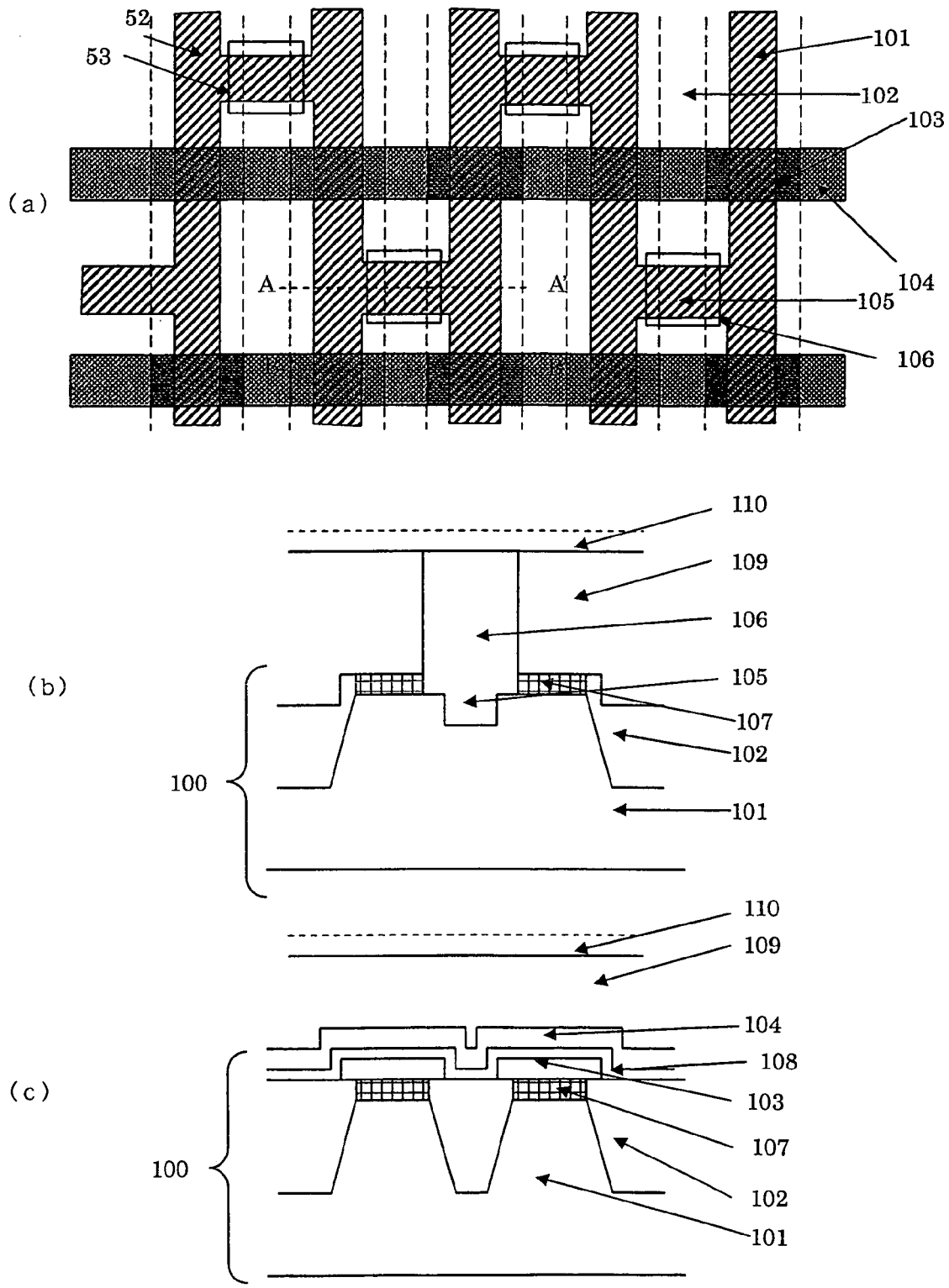
Figures 1, 3:
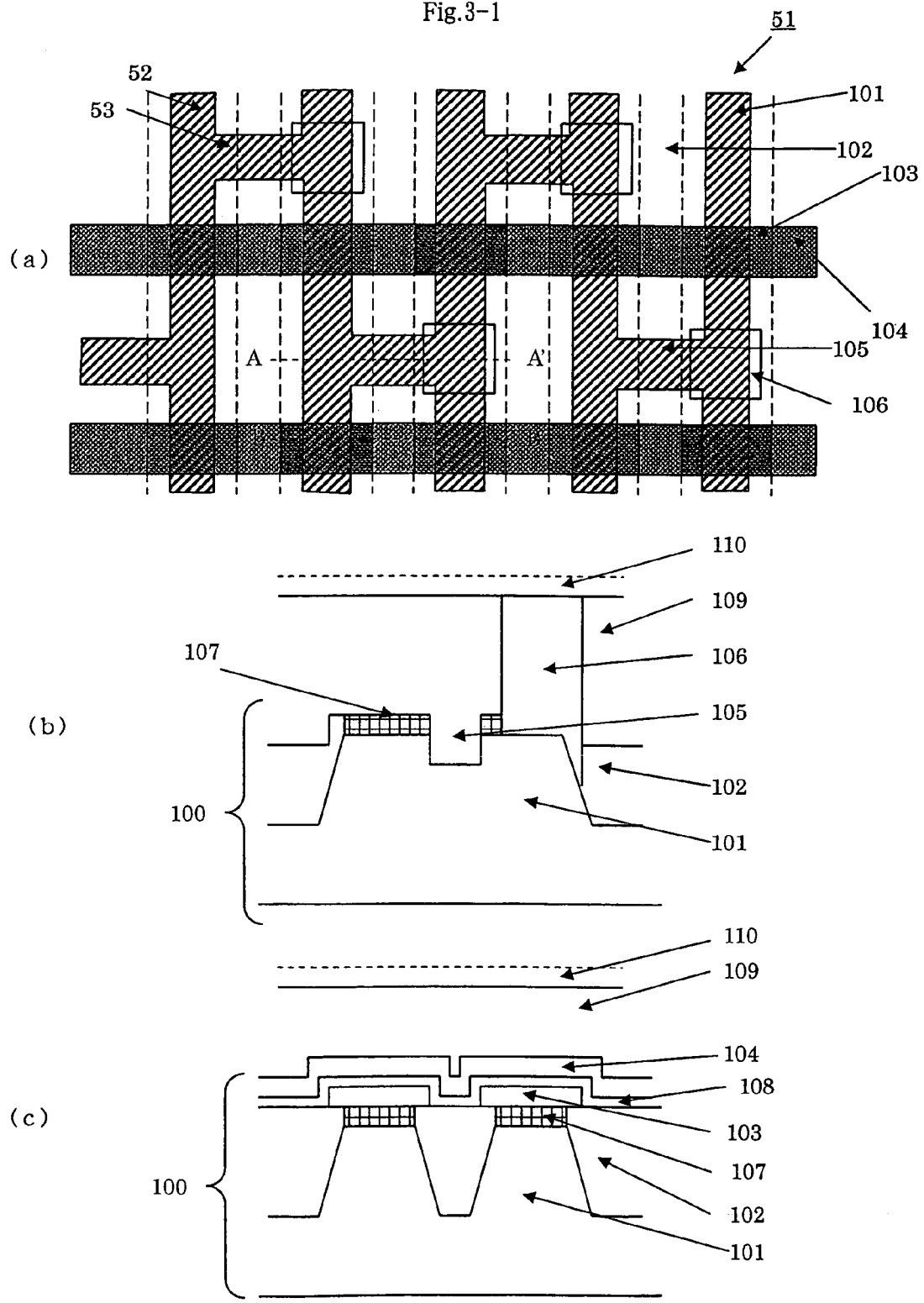
Figures 2, 3:
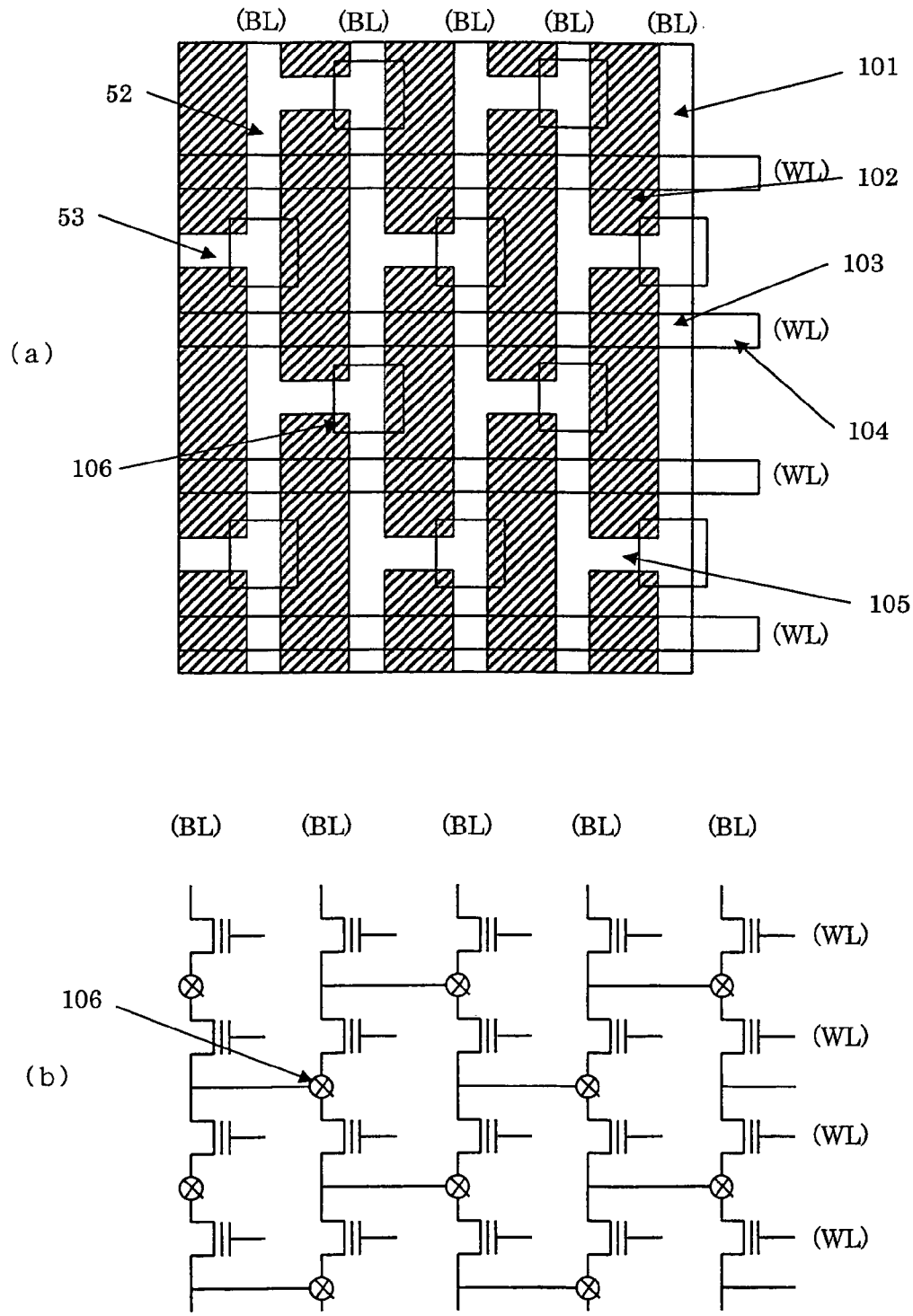

FIGS. 1-1 and 1-2 are respectively diagrams showing structures of the semiconductor memory device according to the present invention. Incidentally, a description will be made here of a nonvolatile memory having floating gates as the semiconductor memory device. FIG. 1-1(a) shows a planar structure of a memory cell of the nonvolatile memory, FIG. 1-1(b) shows a sectional structure of the memory cell, which is taken along line A-A' shown in FIG. 1-1(a), and FIG. 1-1(c) shows a sectional structure of the memory cell, which is taken along line B-B' shown in FIG. 1-1(a), respectively. FIG. 1-2(a) illustrates a planar structure of the memory cell of the nonvolatile memory, and FIG. 1-2(b) depicts an equivalent circuit of the nonvolatile memory shown in FIG. 1-2(a), respectively.

As shown in FIG. 1-1, an active region 101 and device isolation regions 102 are formed within a silicon substrate 100. Incidentally, the active region 101 comprises a plurality of active region columns 52 extending in a first direction (corresponding to a vertical direction as viewed in FIG. 1-1), and a plurality of active region rows 53 extending in a second direction (corresponding to a horizontal direction as viewed in FIG. 1-1) substantially orthogonal to the first direction. A first gate insulating film 107 is formed on its corresponding part of the active region 101 A floating gate 103, which serves as each floating electrode, is selectively formed on each of the first gate insulating film 107 and the device isolation regions 102. A control gate 104, which serves as each control electrode through the second gate insulating film 108, is formed on the device isolation regions 102 of between adjacent floating gates with on the floating gates and in the rows direction of the floating gates. Incidentally, a transistor comprises the floating gate 103 and the control gate 104. An interlayer insulating film 109 is formed on the control gate 104, the first gate insulating film 107, and the device isolation regions 102. An upper wiring 110 is formed on the interlayer insulating film 109. Contacts 106, which extend through the interlayer insulating film 109 and provide electrical connections between the active region 101 and the upper wiring 110, are formed within the interlayer insulating film 109. The upper wiring 110 is formed on the interlayer insulating film 109.

As shown in FIG. 1-1(a), the contacts 106 are respectively disposed on portions (concave portions) 105 that overlap in etching upon formation of a plurality of the gates 103 and 104, so as to cover the entire surfaces of the concave portions 105. That is, the contacts 106 are respectively disposed between respective adjacent intersecting points of the active region columns 52 and the active region rows 53 and placed so as to cover the entire surfaces of portions interposed between respective extension lines (line C-C' and line D-D' in FIG. 1-1(a)) of longitudinal sides on the mutually adjoining sides of the two floating gates 103 adjacent in the transverse direction. Here, the term "cover the entire surfaces of the concave portions 105" or "cover the entire surfaces of the portions interposed between the respective extension lines of the longitudinal sides on the mutually adjoining sides of the two floating gates 103" means that the concave portions 105 are hidden from view by the contacts 106 each identical to or larger than the concave portion 105. The contacts 106 disposed in this way are formed of a contact embedding material which is of a conductive substance. Incidentally, tungsten is principally used as the contact embedding material.

In the semiconductor memory device 1 having such a configuration, the contacts 106 are respectively provided between the respective adjacent intersecting points of the active region columns 52 and the active region rows 53 as shown in FIG. 1-1(a). If the semiconductor memory device 1 constructed in this way is represented in the form of functional constituent elements such as bit lines BL, word lines Wl, source lines (called also source/drain) SL, etc., it is then configured as shown in FIG. 1-2(a). If the semiconductor memory device is expressed in an equivalent circuit, it is then represented as illustrated in FIG. 1-2(b).

Incidentally, such a semiconductor memory device 1 includes a plurality of the transistors each consisting of the floating electrode (floating gate 103) and the control electrode (control gate 104), and the interlayer insulating film 109 and the upper wiring 110 formed on the transistors. Further, the semiconductor memory device 1 is provided with the active region 101 comprising the plurality of active region columns 52 and the plurality of active region rows 53 that connect the plurality of active region columns 52. The semiconductor memory device 1 also has a configuration wherein regions (concave portions 105) removed upon patterning of the floating electrodes are respectively provided on the active region rows 53, and the upper wiring 110 and the regions removed upon patterning of the floating electrodes, which are lying on the active region rows 53, are electrically connected.

<Manufacturing Method of Semiconductor Memory Device>

A method of manufacturing a semiconductor memory device will be explained below using FIGS. 2-1 through 2-5.

FIGS. 2-1 through 2-5 are diagrams showing the method of manufacturing the semiconductor memory device, according to the present invention. FIGS. 2-1(a) through 2-5(a) respectively show a planar structure of a memory cell. FIGS. 2-1(b) through 2-5(b) respectively show a sectional structure of the memory cell and are respectively sectional diagrams taken along lines A-A' of FIGS. 2-1(a) through 2-5(a). FIGS. 2-1(c) through 2-5(c) respectively show a sectional structure of the memory cell and are respectively sectional diagrams taken along lines B-B' of FIGS. 2-1(a) through 2-5(a). Incidentally, FIGS. 2-1 through 2-5 show processes for manufacturing the semiconductor memory device 1 shown in FIGS. 1-1 and 1-2 and can suitably be changed depending on the configuration of the semiconductor memory device 1.

As shown in FIGS. 2-1(a) through 2-1(c), an active region 101 and device isolation regions 102 are formed in a silicon substrate 100.

Next, as shown in FIGS. 2-2(a) through 2-2(c), a first gate insulating film 107 is formed on its corresponding part on the active region 101, and each of floating gates 103 is formed on each of the first gate insulating film 107 and the device isolation regions 102. Incidentally, the floating gate 103 is a conductive film (which principally makes use of polysilicon doped with an impurity) and is formed by the known CVD/photolitho/etching technology.

The floating gate is patterned after formed overall. In this case the first gate insulating film 107 is etched excessively on the position, which the floating gate 103 removed on the active region. The first gate insulating film 107 is usually etched 50 through 70%.

Next, as shown in FIG. 2-3(a) through 2-3(c), the second gate insulating film 108 is formed overall, and the control gate 104 is formed on the second gate insulating film 108. The control gate 104 and the second gate insulating film 108, without which serve as each word line WL, are removed by the known CVD/photolitho/etching technology.

Next, as shown in FIG. 2-4(a) through 2-4(c), the floating gates 103 other than the floating gate 103 under the word line WL is removed by etching processing. Next, as shown in FIG. 2-5(a) through 2-5(c), the interlayer insulating film 109 is formed overall. The interlayer insulating film 109 at the portions (concave portions) 105 that overlap in etching between respective adjacent intersecting points of the active region columns 52 and the active region rows 53 and upon formation of the floating gates 103 and the control gates 104, is removed by etching processing. A contact embedding material (principally tungsten) corresponding to a conductive substance is embedded into holes (contact holes) formed by the above processing to thereby form contacts 106. Incidentally, "the portions (concave portions) 105 that overlap in etching between the respective adjacent intersecting points of the active region columns 52 and the active region rows 53 and upon formation of the floating gates 103 and the control gates 104" correspond to portions interposed between respective extension lines (lines C-C' and D-D' in FIG. 1-1(a)) of longitudinal sides on the mutually adjoining sides of the two floating gates 103 adjacent in a transverse direction in the planar structure. The portions (concave portions) 105 that overlap in etching are formed as trenches or grooves deeper than other regions by etching upon formation of the floating gates 103 and the control gates 104. The contacts 106 are respectively disposed so as to cover the entire surfaces of the concave portions 105. Thus, since the conductive substance (principally tungsten or the like) is embedded into the grooves formed by etching, the semiconductor memory device 1 is capable of suppressing a rise in source line resistance. Incidentally, it is necessary to reliably implant an implant between tungsten embedded in the contact holes and the active region 101 corresponding to a semiconductor layer upon formation of the contacts 106. This is done by ion-implanting an impurity (n-type impurity where the active region 101 is of an n type) of the same type as the active region 101 by a known ion implantation technique after formation of the contact holes by the known CVD/photolitho/etching technology and thereafter embedding tungsten therein.

Thus, the method of manufacturing the semiconductor memory device 1, according to the present embodiment includes a step for forming the active region 101 comprising a plurality of the active region columns 52 extending in a first direction, and a plurality of the active region rows 53 extending in a second direction substantially orthogonal to the first direction and having the concave portions 105, a step for forming floating electrodes (floating gates 103) and control electrodes (control gates 104) on the active region columns 52, a step for forming the interlayer insulating film 109 configured as a layer below an upper wiring 110 on the active region 101 and the control electrodes, and a step for forming conductive sections (contacts 106) which provide electrical connections between the upper wiring 110 and the active region 101, on the concave portions 105 lying on the active region rows 53.

The method of manufacturing the semiconductor memory device 1, according to the present embodiment is a method of manufacturing a semiconductor memory device 1 comprising a plurality of transistors consisting of floating electrodes (floating gate 103) and control electrodes (control gates 104), and an interlayer insulating film 109 and an upper wiring 110 formed on the transistors. The method includes a step for forming an active region 101 comprising a plurality of active region columns 52 and a plurality of active region rows 53 which connect the plurality of active region columns 52, a step for patterning the floating electrodes and removing predetermined regions (i.e., regions which come to the portions 105) on the active region rows 53, and a step for forming conductive sections (contacts 106) which provide electrical connections between the upper wiring 110 and the removed predetermined regions on the active region rows 53.

The method of manufacturing the semiconductor memory device 1, according to the present embodiment includes a step for forming in a silicon substrate 100, an active region 101 comprising a plurality of active region columns 52 extending in a first direction and a plurality of active region rows 53 extending in a second direction substantially orthogonal to the first direction and having concave portions 105, and device isolation regions 102, a step for forming a first gate insulating film 107 on its corresponding part of the active region 101, a step for forming each of floating gates 103 on the first gate insulating film 107 and the device isolation region 102, a step for forming a second gate insulating film 108 on the floating gates 103 in regions in which the floating gates 103 are formed, and on the active region 101 in regions in which no floating gates 103 are formed, a step for forming control gates 104 on the second gate insulating film 108, a step for forming an interlayer insulating film 109 configured as a layer below the upper wiring 110 on the active region 101 and the control gates 104, and a step for forming contacts 106 for providing electrical connections of the upper wiring 110 and the active region 101 on the concave portions 105 lying on the active region rows 53.

<Operation of Semiconductor Memory Device>

In the semiconductor memory device 1 according to the present invention, the concave portion 105 sends an electrical charge to its corresponding floating gate 103 upon writing of data, whereas it functions as a source line SL which becomes a diffusion layer of each transistor formed of the floating gate 103 and the control gate 104, upon reading of data.

<Advantageous Effects>

The semiconductor memory device 1 according to the present invention has the following advantageous effects.

The contacts 106 are respectively disposed so as to cover the entire surfaces of the portions (concave portions) 105 that overlap in etching between the respective adjacent intersecting points of the active region columns 52 and the active region rows 53 and upon formation of the floating gates 103 and the control gates 104. Further, the contacts 106 are embedded with the contact embedding material corresponding to the conductive substance. Therefore, the semiconductor memory device 1 according to the present invention is capable of avoiding an increase in source line resistance as viewed in a current path direction (direction taken along line A-A' shown in FIG. 1-1(a)) of each source line, which is caused by a deep dug portion (i.e., trench formed by etching upon formation of the floating gate 103 and the control gate 104) of the silicon substrate 104 and reducing the source line resistance as compared with the conventional semiconductor memory device 51.

Also the contacts 106 are respectively disposed between the respective adjacent intersecting points of the active region columns 52 and the active region rows 53. Therefore, the area where the contact 106 makes contact with the active region 101 at its bottom, becomes small as compared with the case in which the contacts 106 are disposed on the intersecting points of the active region columns 52 and the active region rows 53 as in the conventional semiconductor memory device (see FIG. 3-1(a)). The influence of an increase in contact resistance is considered here. However, with miniaturization of patterning in recent years, divots due to wet processing in an STI forming process occur at the boundary between the active region 101 and each device isolation region 102 where, for example, the device isolation method is changed from the conventional LOCOS method to the STI (Shallow Trench Isolation) method. Therefore, excessive etching is required to etch the conductive film of each divot in the process of forming the control gates 104, thus causing a further increase in substrate digging of each source line SL. However, the substrate digging of the source line SL greatly influences the resistance of the entire current path rather than the area where each contact 106 makes contact with the active region 101 at its bottom. Therefore, the semiconductor memory device 1 according to the present invention acts in the direction to avoid the influence of the substrate digging of the source line SL. As a result, the semiconductor memory device 1 according to the present invention is capable of improving charge retention characteristics since a current value at the writing of data increases.

As shown in FIG. 2-5(a), the contacts 106 are disposed sufficiently distant from the device isolation regions 102. Therefore, the semiconductor memory device 1 according to the present invention is capable of increasing an allowable rage for patterning alignment displacements in the transverse direction (direction taken along line A-A') of the planar structure at the pattern formation of each contact 106 and enhancing stability of yields.

It is preferable that in the semiconductor memory device 1 according to the present invention, the contacts 106 are formed small and the control gates 104 lying in the vicinity of the contacts 106 are formed on a large scale, as viewed in the transverse direction (direction taken along line A-A') of the planar structure. Thus, the semiconductor memory device 1 according to the present invention is capable of remarkably reducing the wiring width of each control gate 104 and achieving a further reduction in source line resistance.

The semiconductor memory device 1 includes a plurality of transistors comprising floating electrodes (floating gates 103) and control electrodes (control gates 104), and an interlayer insulating film 109 and an upper wiring 110 formed on the transistors. The semiconductor memory device 1 also includes an active region 101 comprising a plurality of active region columns 52 and a plurality of active region rows 53 which connect the plurality of active region columns 52. Further, the semiconductor memory device 1 has a configuration wherein regions (concave portions 105) removed upon patterning of the floating electrodes are respectively provided on the active region rows 53, and the upper wiring 110 and the regions removed upon patterning of the floating electrodes, which are provided on the active region rows 53, are electrically connected.

Thus, the upper wiring 110 formed on the transistors and the regions (concave portions 105) removed upon patterning of the floating electrodes, which are provided on the active region rows 53, are electrically connected in the semiconductor memory device 1. It is, therefore, possible to suppress an increase in resistance value.

The present invention is not necessarily limited to the above embodiments. Various applications and modifications are considered within the scope not departing from the substance of the present invention.

If semiconductor memory devices each having a laminated gate structure are adopted, then the present invention is applicable to all of them.

What is claimed is:

1. A semiconductor memory device comprising:
   a semiconductor substrate which includes an active region having a plurality of active column portions extending in a first direction and a plurality of active row portions extending in a second direction substantially orthogonal to the first direction, and isolation portions, wherein the active row portions are arranged between and connected to respective pairs of active column portions and wherein respective concave portions are disposed within each active row portion between corresponding pairs of the active column portions;
   a floating gate formed over the semiconductor substrate;
   a control gate formed over the floating gate as crossing and extending over the active column portions and the isolation portions;
   an interlayer insulating film formed over the active region;
   a wiring formed over the interlayer insulating film; and
   conductive members arranged and buried within the concave portions, the conductive members pass through the interlayer insulating film and connect to the wiring and to the active row portions between the corresponding pairs of the active column portions.

2. The semiconductor memory device of claim 1, further comprising a transistor consisting of one of the active column portions, the floating gate, and the control gate.

3. The semiconductor memory device of claim 1, wherein the concave portions are formed in the active row portions when the floating gate is patterned.

4. The semiconductor memory device of claim 1, wherein the floating gate and the control gate extend in the second direction.

5. The semiconductor memory device of claim 1, wherein the floating gate and the control gate are over areas of the semiconductor substrate without the active row portions.

6. The semiconductor memory device of claim 1, wherein the concave portions are formed in a vicinity of a center of the active row portions.

7. The semiconductor memory device of claim 1, wherein the concave portions have a bottom surface and side surfaces.

8. The semiconductor memory device of claim 7, wherein the conductive members are connected to the bottom surface and the side surfaces of the concave portions.

9. A semiconductor memory device comprising:
   a semiconductor substrate which includes an active region having a plurality of active region columns extending in a first direction and a plurality of active region rows extending in a second direction substantially orthogonal to the first direction, and an isolation region,
   wherein each active region row is a semiconductor material, is arranged between active region columns and has a concave portion therein;
   a floating gate formed over the semiconductor substrate;
   a control gate formed over the floating gate as crossing and extending over the active region columns and the isolation region;
   an interlayer insulating film formed over the active region;
   a wiring formed over the interlayer insulating film; and
   conductive members arranged and buried within the concave portions, the conductive members pass through the interlayer insulating film and connect to the wiring and to the active region.

10. The semiconductor memory device of claim 9, further comprising a transistor consisting of one of the active region columns, the floating gate, and the control gate.

11. The semiconductor memory device of claim 9, wherein the floating gate and the control gate extend in the second direction.

12. The semiconductor memory device of claim 9, wherein the floating gate and the control gate are over areas of the semiconductor substrate without the active region rows.

13. The semiconductor memory device of claim 9, wherein the concave portions are formed in a vicinity of a center of the active region rows.

14. The semiconductor memory device of claim 9, wherein the conductive members are connected to the semiconductor material at bottom and side surfaces of the concave portions.

* * * * *